United States Patent
Kim et al.

(10) Patent No.: US 12,040,530 B2
(45) Date of Patent: Jul. 16, 2024

(54) PACKAGE BOARD, ANTENNA PACKAGE INCLUDING THE SAME AND IMAGE DISPLAY DEVICE INCLUDING THE SAME

(71) Applicant: DONGWOO FINE-CHEM CO., LTD., Jeollabuk-do (KR)

(72) Inventors: Na Yeon Kim, Seoul (KR); Young Ju Kim, Gyeonggi-do (KR); Hee Jun Park, Gyeonggi-do (KR); Won Hee Lee, Gyeonggi-do (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 199 days.

(21) Appl. No.: 17/878,229

(22) Filed: Aug. 1, 2022

(65) Prior Publication Data

US 2023/0043504 A1 Feb. 9, 2023

(30) Foreign Application Priority Data

Aug. 4, 2021 (KR) .......................... 10-2021-0102415

(51) Int. Cl.
*H01Q 1/12* (2006.01)
*H05K 1/00* (2006.01)
*H05K 1/02* (2006.01)
*H05K 1/11* (2006.01)

(52) U.S. Cl.
CPC .............. *H01Q 1/12* (2013.01); *H05K 1/0243* (2013.01); *H05K 1/0277* (2013.01); *H05K 1/112* (2013.01); *H05K 2201/056* (2013.01); *H05K 2201/10098* (2013.01)

(58) Field of Classification Search
CPC ............ H01Q 1/24; H01Q 1/243; H01Q 1/12; H01Q 21/00; H01Q 21/08; H01Q 9/04; H01Q 9/0407; H01Q 9/40; H05K 1/00; H05K 1/11; H05K 1/112; H05K 1/113; H05K 1/117; H05K 1/118; H05K 1/0277; H05K 1/0218; H05K 1/0243; H05K 1/147;
(Continued)

(56) References Cited

U.S. PATENT DOCUMENTS

2018/0205155 A1* 7/2018 Mizunuma ............... H04B 7/00
2019/0327834 A1* 10/2019 Kim ........................ H01Q 25/00
(Continued)

FOREIGN PATENT DOCUMENTS

KR    10-2013-0095451 A    8/2013
KR    10-1313684 B1    10/2013

*Primary Examiner* — Thai Pham
(74) *Attorney, Agent, or Firm* — The PL Law Group, PLLC

(57) ABSTRACT

A package board according to an embodiment includes a first core layer having a first surface and a second surface that face each other, a feeding wiring extending on the first surface of the first core layer, a first via structure penetrating through the first core layer, a first connection pad disposed on the second surface of the first core layer to be electrically connected to the feeding wiring through the first via structure, the first connection pad including a head portion in contact with the first via structure and an extension portion protruding from the head portion, and a first connector mounted on the second surface of the first core layer, the first connector including a first terminal electrically connected to the extension portion of the first connection pad.

16 Claims, 7 Drawing Sheets

(58) Field of Classification Search
CPC ..... H05K 2201/05; H05K 2201/10189; H05K 2201/10098; H05K 2201/10128
See application file for complete search history.

(56) References Cited

U.S. PATENT DOCUMENTS

2020/0119452 A1* 4/2020 Kylkilahti ................ H01Q 1/38
2021/0242569 A1* 8/2021 Fujii ........................ H01Q 1/48

* cited by examiner

PACKAGE BOARD, ANTENNA PACKAGE INCLUDING THE SAME AND IMAGE DISPLAY DEVICE INCLUDING THE SAME

CROSS-REFERENCE TO RELATED APPLICATION AND CLAIM OF PRIORITY

This application claims the benefit under 35 USC § 119 of Korean Patent Application No. 10-2021-0102415 filed on Aug. 4, 2021, in the Korean Intellectual Property Office (KIPO), the entire disclosures of which are incorporated herein by reference for all purposes.

BACKGROUND

1. Field

The present invention relates to a package board, an antenna package including the same and an image display device including the same. More particularly, the present invention relates to a package board including a feeding wiring and a connector, an antenna package including the same and an image display device including the same.

2. Description of the Related Art

As information technologies have been developed, a wireless communication technology such as Wi-Fi, Bluetooth, etc., is combined with an image display device in, e.g., a smartphone form. In this case, an antenna may be combined with the image display device to provide a communication function.

According to developments of a mobile communication technology, an antenna capable of implementing, e.g., high frequency or ultra-high frequency band communication is needed in the display device.

However, as a driving frequency of the antenna increases, a signal loss may be increased. As a length of a transmission path increases, the signal loss may be further increased.

To connect the antenna to, e.g., a main board of an image display device, a package board including a flexible printed circuit board and a connection intermediate structure such as a connector may be used. In this case, a signal loss and a phase difference between circuits may be further increased by the connection intermediate structure.

Accordingly, construction of a circuit connection structure for achieving reliability of an electrical connectivity while maintaining or improving radiation properties of the antenna is needed.

SUMMARY

According to an aspect of the present invention, there is provided a package board having improved electrical reliability.

According to an aspect of the present invention, there is provided an antenna package including a package board having improved electrical reliability.

According to an aspect of the present invention, there is provided an image display device including a package board having improved electrical reliability.

(1) A package board, including: a first core layer having a first surface and a second surface that face each other; a feeding wiring extending on the first surface of the first core layer; a first via structure penetrating through the first core layer; a first connection pad disposed on the second surface of the first core layer to be electrically connected to the feeding wiring through the first via structure, the first connection pad including a head portion in contact with the first via structure and an extension portion protruding from the head portion; and a first connector mounted on the second surface of the first core layer, the first connector including a first terminal electrically connected to the extension portion of the first connection pad.

(2) The package board of the above (1), further including a first ground formed on the second surface of the first core layer and spaced apart from the first connection pad to surround the first connection pad.

(3) The package board of the above (2), wherein the first connection pad and the first ground are disposed at the same level.

(4) The package board of the above (2), wherein a distance from a center of the head portion to the first ground is constant.

(5) The package board of the above (4), wherein the head portion has a circular shape.

(6) The package board of the above (2), wherein the first ground entirely surrounds the first connection pad in a plan view (7) The package board of the above (2), wherein a separation space having a closed trench shape is formed between the first ground and the first connection pad.

(8) The package board of the above (1), wherein a width of the extension portion is smaller than a width of the head portion.

(9) The package board of the above (1), wherein the feeding wiring includes a feeding pad portion electrically connected to the first via structure at a terminal end portion thereof, and the feeding pad portion has a width expanded from the feeding wiring.

(10) The package board of the above (1), wherein a plurality of the first connection pads are arranged to form first connection pad columns which forms a double-column structure disposed in a width direction of the first core layer, and the first connection pad columns are arranged such that first connection pads included in different first connection pad columns are staggered from each other in the width direction.

(11) An antenna package, including: an antenna device including an antenna unit; and the package board according to embodiments as described above electrically connected to the antenna unit through the feeding wiring.

(12) The antenna package of the above (11), wherein the antenna unit includes a radiator, a transmission line connected to the radiator and a signal pad connected to an end portion of the transmission line, and the signal pad is electrically connected to the feeding wiring.

(13) The antenna package of the above (11), further including: a circuit board including a second core layer, a connection wiring extending on one surface of the second core layer and a second via structure penetrating through the second core layer; a second connection pad disposed on the other surface of the second core layer and electrically connected to the connection wiring through the second via structure; and a second connector mounted on the other surface of the second core layer to be coupled to the first connector, the second connector including a second terminal electrically connected to the second connection pad and the first terminal.

(14) The antenna package of the above (13), further including a second ground disposed on the other surface of the second core layer and spaced apart from the second connection pad to surround the second connection pad, and the second connection pad and the second ground are disposed at the same level.

(15) The antenna package of the above (13), further including an antenna driving integrated circuit chip mounted on the other surface of the second core layer and electrically connected to the second connector through the connection wiring and the second via structure.

(16) An image display device, including: a display panel; and the antenna package according to embodiments as described above disposed on the display panel.

According to exemplary embodiments of the present invention, a first connector and a feeding wiring disposed on different surfaces of a package board may be electrically connected through a first via structure and a first connection pattern. Thus, a signal loss in an intermediate structure may be reduced.

The first connection pattern may include a head portion having a circular shape and an extension portion protruding from the head portion. In exemplary embodiments, a distance from the first via structure and/or a terminal end portion of the feed wiring connected to a center of the head portion to a first ground may be uniform in all directions. Accordingly, noises transmitted to the feeding wiring or the first connection pattern may be uniformly shielded regardless of the directions, and a signal efficiency of an antenna device may be improved.

In exemplary embodiments, the package board bonded to the antenna device and a circuit board on which an antenna driving integrated circuit chip is mounted may be electrically connected to each other through a connector structure. Accordingly, a bonding process or an attachment process for connecting the package board and the circuit board may be omitted, and a stable circuit board connection may be easily implemented.

DETAILED DESCRIPTION OF THE EMBODIMENTS

According to exemplary embodiments of the present invention, there is provided a package board including a feeding wiring, a connection pad and a connector. According to exemplary embodiments of the present invention, there is also provided an antenna package and an image display device including the package board.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

Figure 1:
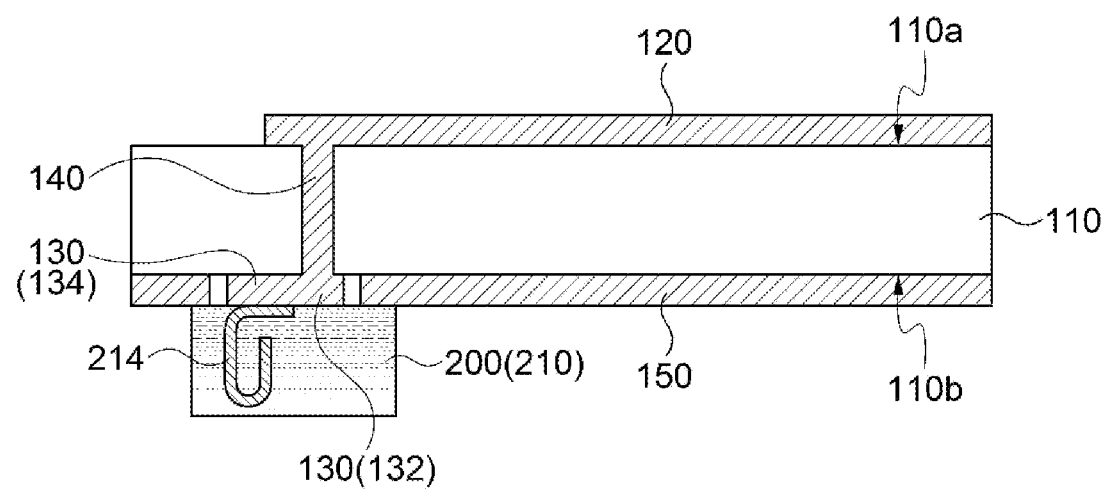
FIGS. 1 and 2 are a schematic cross-sectional view and a schematic top plan view, respectively, illustrating a package board in accordance with exemplary embodiments.
Figure 2:
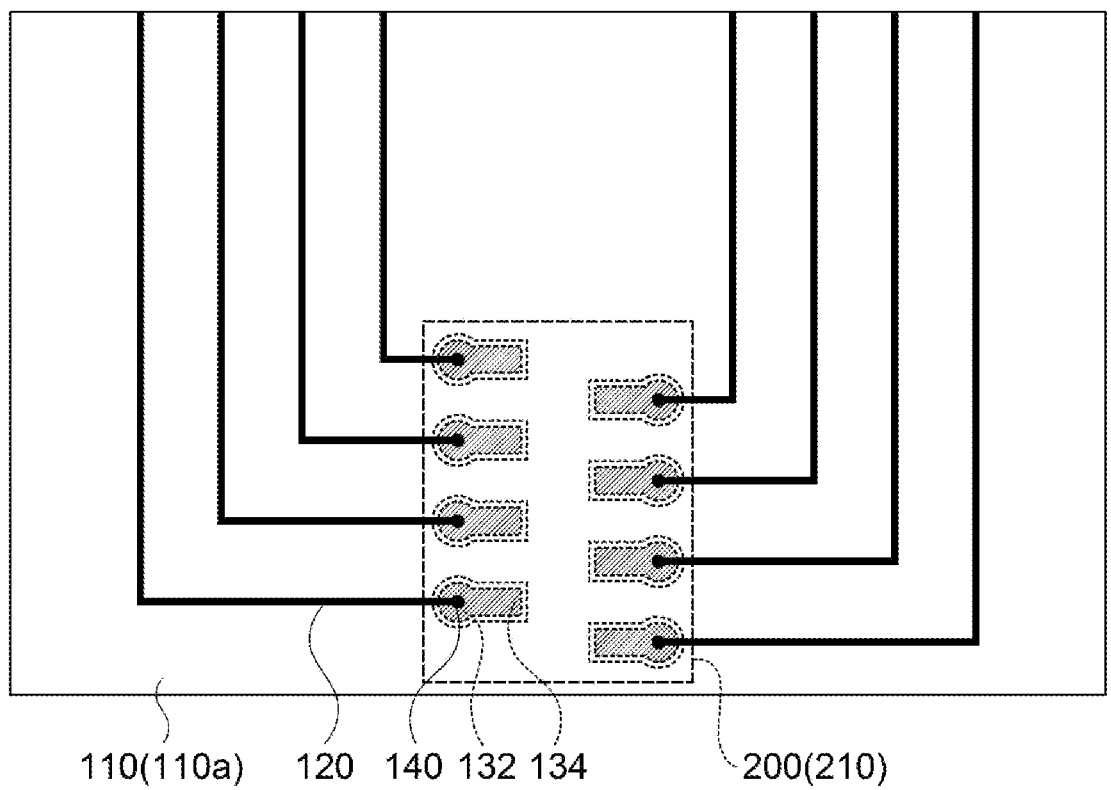

FIGS. 1 and 2 are a schematic cross-sectional view and a schematic top plan view, respectively, illustrating a package board in accordance with exemplary embodiments.

Referring to FIGS. 1 and 2, a package board 100 may include a first core layer 110, a feeding wiring 120, a first connection pad 130, a first via structure 140 and a first connector 210.

For example, the first core layer 110 may serve as a core layer of a flexible printed circuit board (FPCB).

The first core layer 110 may include, e.g., a flexible resin such as a polyimide resin, modified polyimide (MPI), an epoxy resin, polyester, a cycloolefin polymer (COP), a liquid crystal polymer (LCP), or the like. The first core layer 110 may include an internal insulating layer included in the package board 100.

For example, the first core layer 110 may include a first surface 110*a* and a second surface 110*b* that face each other.

In exemplary embodiments, the feeding wiring 120 may be disposed and extend on the first surface 110*a* of the first core layer 110.

In an embodiment, the feeding wiring 120 may serve as a feeding line of an antenna unit as will be described later. For example, one end portion of the feeding wiring 120 may be electrically connected to the antenna unit, and an opposite end portion of the feeding wiring 120 may be electrically connected to the connector 210 through the first via structure 140 and the first connection pad 130.

For example, the first via structure 140 may be formed as substantially the same member with the feeding wiring 120. For example, a via hole penetrating through the first core layer 110 may be formed, and the feeding wiring 120 and the first via structure 140 may be formed of substantially the same material.

In exemplary embodiments, the first connection pad 130 may be disposed on the second surface 110*b* of the first core layer 110.

For example, the first connection pad 130 may be connected to a terminal end portion (e.g., a feeding pad portion 122) of the feeding wiring 120 through the first via structure 140 penetrating the first core layer 110. In this case, an electrical connection between a first terminal 214 of the first connector 210 and the feeding wiring 120 may be easily implemented through the first connection pad 130. Accordingly, a signal loss due to the electrical connection between the first connector 210 and the feeding wiring 120 may be reduced.

For example, the first connector 210 may be mounted using a surface mounting technology (SMT) on the second surface 110*b* of the first core layer 110 such that the first terminal 214 may be electrically connected to the first connection pad 130. Accordingly, an intermediate structure of the feed wiring 120—the first via structure 140—the first connection pad 130—the first connector 210 may be formed.

In some embodiments, the first ground 150 may be disposed on the second surface 110*b* of the first core layer 110.

For example, the first ground 150 may be spaced apart from the first connection pad 130 on the second surface 110*b* to surround the first connection pad 130. In this case, noises that may be generated in the connection structure of the feeding wiring 120—the first via structure 140—the first connection pad 130 may be shielded, and the signal loss may be reduced. Accordingly, an efficiency of a signal transmitted to the antenna unit may be increased.

In some embodiments, the first ground 150 and the first connection pad 130 may be disposed at the same level. Thus, a distance between the first connection pad 130 and the first ground 150 may become relatively uniform. Accordingly, the above-described noise shielding and signal loss prevention may be more effectively implemented.

For example, a metal and/or alloy of substantially the same as that included in the antenna unit may be used in the feeding wiring 120, the first via structure 140, the first connection pad 130 and the first ground 150.

Figure 3:
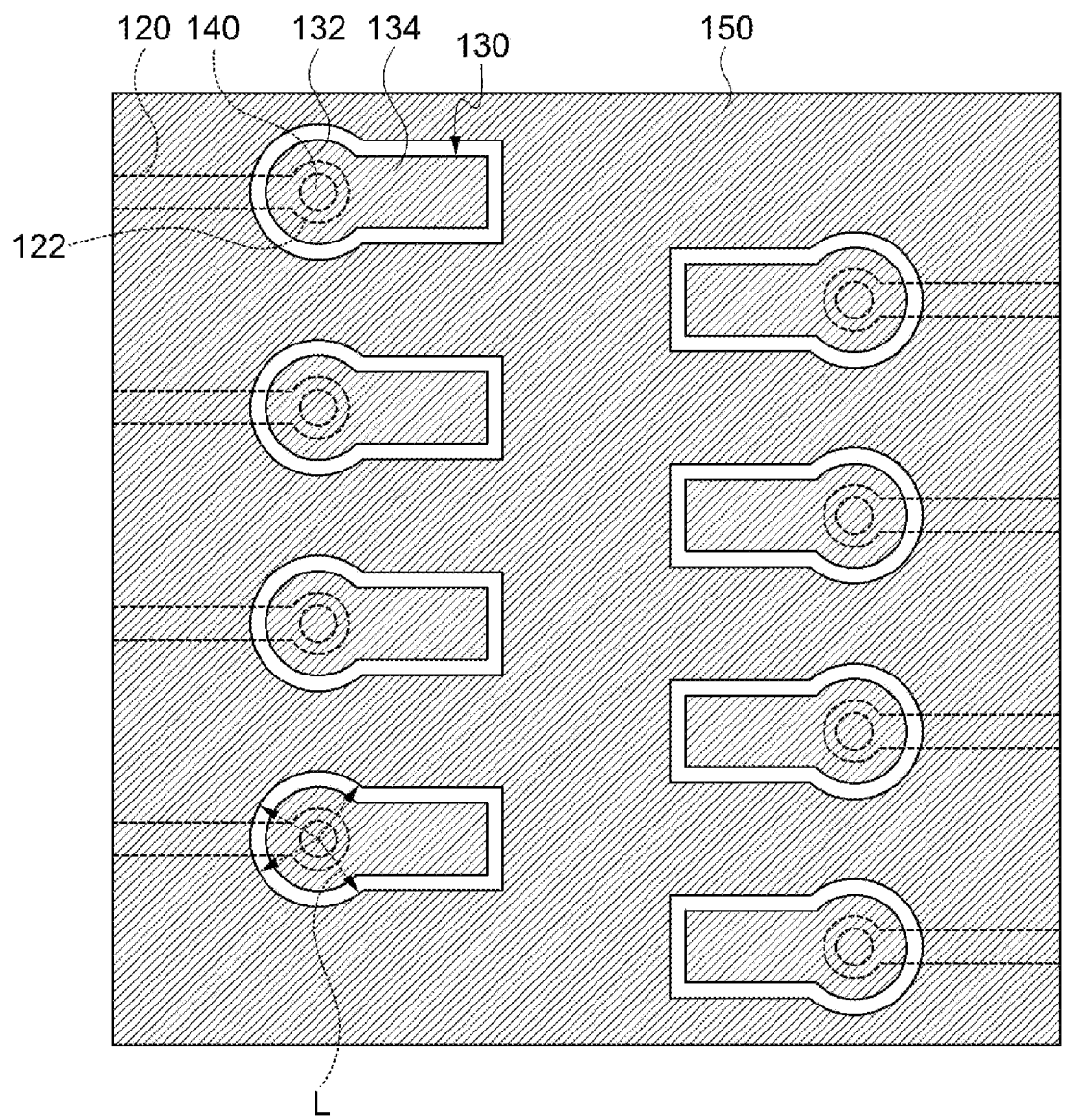
FIGS. 3 and 4 are a schematic top plan view and a schematic perspective view, respectively, illustrating a package board in accordance with exemplary embodiments.
Figure 4:
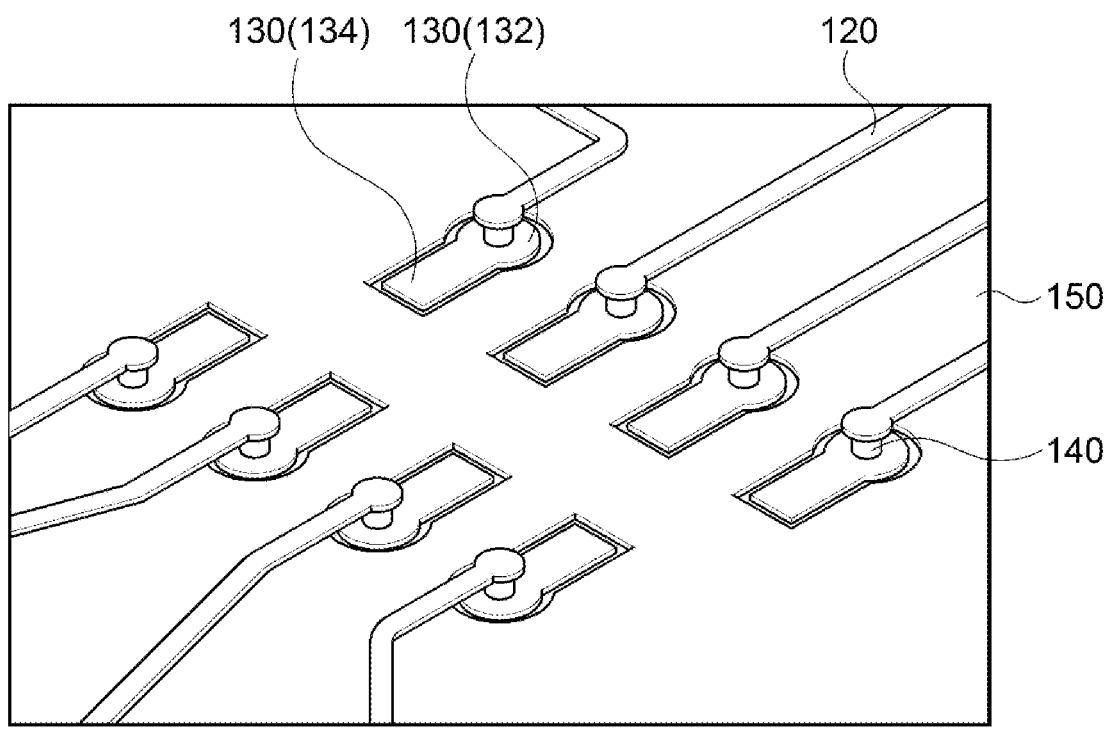

FIGS. 3 and 4 are a schematic top plan view and a schematic perspective view, respectively, illustrating a package board in accordance with exemplary embodiments. Specifically, FIG. 3 is a schematic plan view for describing construction and arrangement of the above-described first connection pad 130 and the first ground 150. FIG. 4 is a schematic perspective view for describing a connection structure of the feeding wiring 120—the first via structured 140—the first connection pad 130. In FIG. 4, illustration of the first core layer 110 is omitted for convenience of descriptions.

Referring to FIGS. 3 and 4, for example, the first connection pad 130 may include a head portion 132 in contact with the first via structure 140 and an extension portion 134 protruding from the head portion 132 to be electrically connected to the first terminal 214 of the connector 210. For example, the extension portion 134 may have a polygonal shape. In an embodiment, the extension portion 134 may have a rectangular shape.

In some embodiments, the first connection pad 130 may be electrically connected to the first via structure 140 at a central portion of the head portion 132. For example, the central portion of the head portion 132 may be in contact with a central portion of the first via structure 140.

In some embodiments, the feeding wiring 120 may include a feeding pad portion 122 electrically connected to the first via structure 140 at a terminal end portion thereof.

The feeding pad portion 122 may have a width expanded from the feeding wiring 120. The width of the feeding wire 120 may refer to a line thickness of the feeding wire 120, and the width of the feeding pad portion 122 may refer to a diameter of the feeding pad portion 122 having a circular shape.

In this case, an electrical resistance at a contact portion between the first via structure 140 and the feeding pad portion 122 may be reduced. Accordingly, a signal loss due to the intermediate structure of the package board 100 may be prevented.

In some embodiments, a distance L from the center of the head portion 132 to the first ground 150 may be substantially the same in all directions. The first ground 150 may be spaced apart from the head portion 132 to surround the head portion 132.

In exemplary embodiments, a distance from the first via structure 140 in contact with the center of the head portion 132 to the first ground 150 may be uniform regardless of directions. Accordingly, a distance from the feeding wiring 120 (e.g., the feeding pad portion 122) in contact with the first via structure 140 to the first ground 150 may be uniform regardless of the direction.

Further, a uniform shielding effect with respect to noises in all directions transmitted to the feeding wiring 120 may be implemented. Accordingly, the signal loss in the connection structure of the feed wiring 120—the first via structure 140—the first connection pad 130 may be reduced. Additionally, the signal loss of the feeding wiring 120 may be reduced, so that signal transmission/reception efficiency of the antenna unit may be enhanced.

The head portion 132 may have, e.g., a circular shape, and the separation distance L from the center of the circle shape to the first ground 150 may be substantially the same. Accordingly, the above-described uniform noise shielding and signal loss reduction may be implemented.

The first ground 150 surrounding the head portion 132 may refer to a region except for a region surrounding the extension portion 134 among the first ground 150 surrounding the first connection pad 130.

Additionally, the distance L from the center of the head portion 132 to the first ground 150 surrounding the head portion 132 may refer to a linear distance from a central point of the head portion 132 to a boundary of the first ground 150 surrounding the head portion 132.

The term "substantially the same" used herein is not limited to a case that is mathematical the same, and may include a case that is similar to be regarded as being substantially the same.

In some embodiments, the first terminal 214 of the first connector 210 may contact the extension portion 134 of the first connection pad 130. Thus, the first terminal 214 may not directly contact the head portion 132 to which the first via structure 140 is in contact, so that signal interference and overlap may be prevented.

In some embodiments, a plurality of the first connection pads 130 may be arranged to form first connection pad columns having a double-column structure disposed in a width direction of the first core layer 110.

For example, the first connection pad columns may be arranged such that the first connection pads 130 included in different first connection pad columns may be staggered or offset from each other in the width direction. In this case, a sufficient separation distance may be obtained between the first terminals 214 electrically connected to the first connection pads 130. Accordingly, signal interference and signal loss between the neighboring first connection pads 130 or between the neighboring first terminals 214 may be reduced.

For example, the first ground 150 may be disposed between the first connection pads 130 or the first terminals 214. In this case, a repeated arrangement structure of the first connection pad 130 (or the first terminal 214) and the first ground 150 may be formed. Accordingly, an additional signal interference prevention and noise shielding effect between the connection pads or the terminals may be implemented.

As illustrated in FIG. 3, the above-described first ground 150 may completely surround the first connection pad 130 when viewed in a planar direction. In this case, noises transmitted to the first connection pad 130, the first via structure and/or the feeding wiring 120 may be shielded in all directions. Accordingly, the signal loss in the package board 100 may be reduced.

As described above, the first ground 150 and the first connection pad 130 may be spaced apart from each other.

In some embodiments, a separation space in the form of a closed trench may be formed between the first ground 150 and the first connection pad 130. For example, the first ground 150 may be spaced apart from the first connection pad 130 while completely surrounding the first connection pad 130. Accordingly, signal disturbance may be prevented and impedance matching may be improved while implementing a uniform noise shielding.

In some embodiments, a width of the extension portion 134 of the first connection pad 130 may be smaller than a width of the head portion 132. For example, the width of the head portion 132 may be a diameter of a circle forming the head portion 132, and the width of the extension portion 134 may be a length of the extension portion 134 in a direction perpendicular to a direction in which the extension portion 134 protrudes.

Thus, a resistance at a portion where the first via structure 140 contacts the head portion 132 of the first connection pad 130 may be lowered. Accordingly, the signal efficiency of the package board 100 may be improved.

In some embodiments, an additional layer may be stacked on the first core layer 110. For example, the additional layer may include a protective layer, an optical layer, a coverlay film, etc. For example, the coverlay film may be formed on the first core layer 110 to cover the above-described feeding wirings 120.

Figure 5:
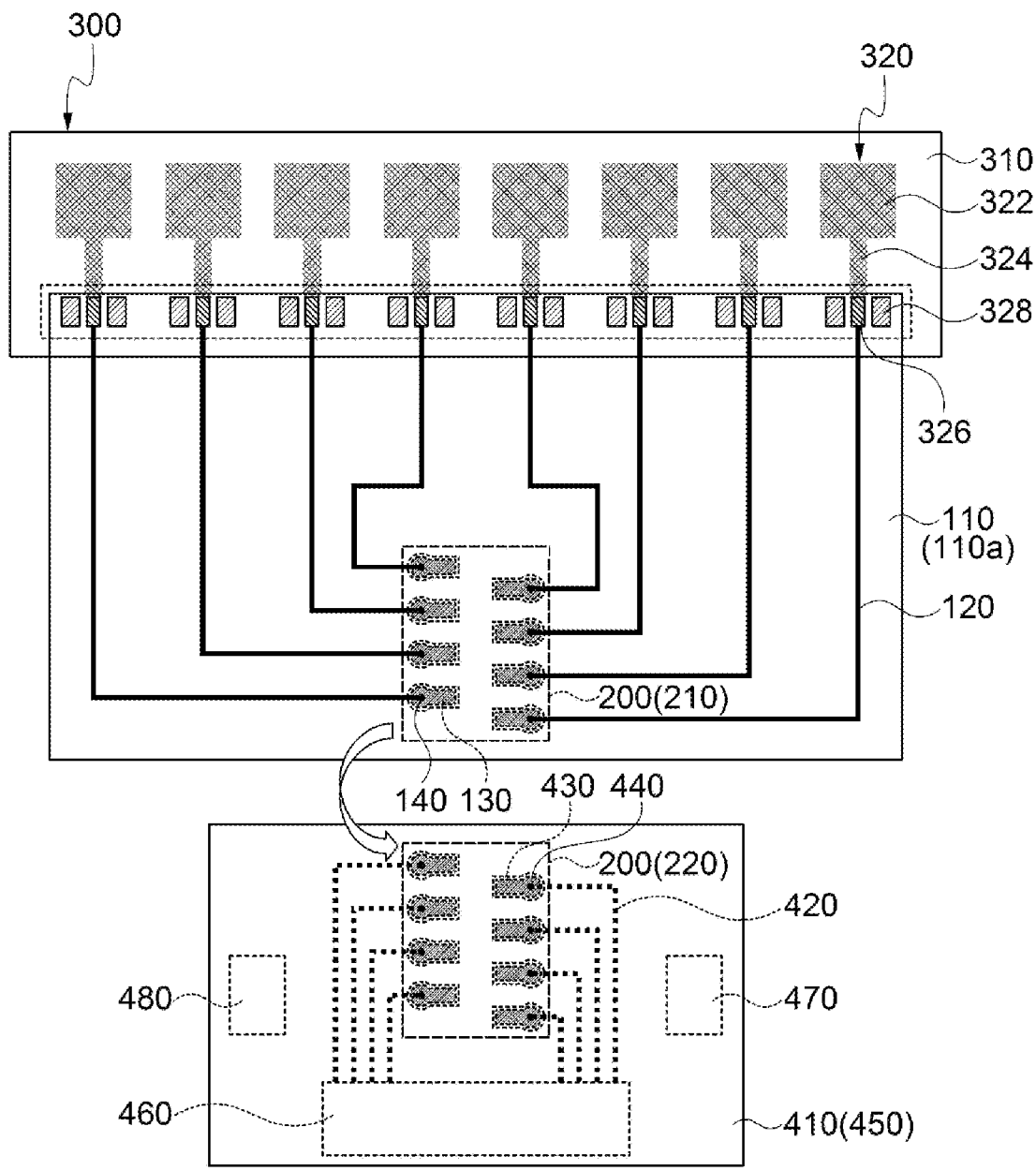
FIG. 5 is a schematic top plan view illustrating an antenna package in accordance with exemplary embodiments.

FIG. 5 is a schematic top plan view illustrating an antenna package in accordance with exemplary embodiments.

Referring to FIG. 5, an antenna package includes an antenna device 300, the package board 100 and a circuit board 400, and the package board 100 and the circuit board 400 may be electrically connected through the connector 200.

The antenna device 300 may include an antenna dielectric layer 310 and an antenna unit 320 disposed on the antenna dielectric layer 310.

The antenna dielectric layer 310 may include a transparent resin film that may include a polyester-based resin such as polyethylene terephthalate, polyethylene isophthalate, polyethylene naphthalate and polybutylene terephthalate; a cellulose-based resin such as diacetyl cellulose and triacetyl cellulose; a polycarbonate-based resin; an acrylic resin such as polymethyl (meth)acrylate and polyethyl (meth)acrylate; a styrene-based resin such as polystyrene and an acrylonitrile-styrene copolymer; a polyolefin-based resin such as polyethylene, polypropylene, a cycloolefin or polyolefin having a norbornene structure and an ethylene-propylene copolymer; a vinyl chloride-based resin; an amide-based resin such as nylon and an aromatic polyamide; an imide-based resin; a polyethersulfone-based resin; a sulfone-based resin; a polyether ether ketone-based resin; a polyphenylene sulfide resin; a vinyl alcohol-based resin; a vinylidene chloride-based resin; a vinyl butyral-based resin; an allylate-based resin; a polyoxymethylene-based resin; an epoxy-based resin; a urethane or acrylic urethane-based resin; a silicone-based resin, etc. These may be used alone or in a combination of two or more therefrom.

In some embodiments, an adhesive film such as an optically clear adhesive (OCA) or an optically clear resin (OCR) may be included in the antenna dielectric layer 310. In some embodiments, the antenna dielectric layer 310 may include an inorganic insulating material such as silicon oxide, silicon nitride, silicon oxynitride, glass, or the like.

In some embodiments, a dielectric constant of the antenna dielectric layer 310 may be adjusted in a range from about 1.5 to about 12. When the dielectric constant exceeds about 12, a driving frequency may be excessively decreased, so that driving in a desired high or ultra-high frequency band may not be implemented.

The antenna unit 320 may be formed on a top surface of the antenna dielectric layer 310. For example, a plurality of the antenna units 320 may be arranged in an array form along a width direction of the antenna dielectric layer 310 or the antenna package to form an antenna unit row.

The antenna unit 320 may include a radiator 322 and a transmission line 324. The radiator 322 may have, e.g., a polygonal plate shape, and the transmission line 324 may extend from a side of the radiator 322. The transmission line 324 may be formed as a single member substantially integral with the radiator 322, and may have a width smaller than that of the radiator 322.

The antenna unit 320 may further include a signal pad 326. The signal pad 326 may be connected to one end portion of the transmission line 324. In an embodiment, the signal pad 326 may be formed as a member substantially integral with the transmission line 324, and a terminal end portion of the transmission line 124 may serve as the signal pad 126.

In some embodiments, a ground pad 328 may be disposed around the signal pad 326. For example, a pair of the ground pads 328 may be disposed to face each other with the signal pad 326 interposed therebetween. The ground pad 328 may be electrically and physically separated from the transmission line 324 and the signal pad 326.

In some embodiments, the antenna dielectric layer 310 may serve as the first core layer 110 of the package board 100. In this case, the first core layer 110 may be provided as a member substantially integral with the antenna dielectric layer 310. Additionally, the feeding wiring 120 may be directly connected to the transmission line 324, and the signal pad 326 may be omitted.

In exemplary embodiments, the antenna unit 320 or the radiator 322 may be designed to have a resonance frequency corresponding to a high frequency or ultra-high frequency band such as 3G, 4G, 5G or higher band. In a non-limiting example, the resonance frequency of the antenna unit 320 may be about 10 GHz or more, or from about 20 GHz to 45 GHz.

In some embodiments, the radiators 322 having different sizes may be arranged on the antenna dielectric layer 310. In this case, the antenna device 300 may serve as a multi-radiation or multi-band antenna radiating in a plurality of resonance frequency bands.

The antenna unit 320 may include silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), molybdenum (Mo), calcium (Ca) or an alloy containing at least one of the metals. These may be used alone or in combination thereof.

In an embodiment, the antenna unit 320 may include silver (Ag) or a silver alloy (e.g., silver-palladium-copper (APC)), or copper (Cu) or a copper alloy (e.g., a copper-calcium (CuCa)) to implement a low resistance and a fine line width pattern.

In some embodiments, the antenna unit 320 may include a transparent conductive oxide such as indium tin oxide (ITO), indium zinc oxide (IZO), zinc oxide (ZnOx), indium zinc tin oxide (IZTO), etc.

In some embodiments, the antenna unit 320 may include a stacked structure of a transparent conductive oxide layer and a metal layer. For example, the antenna unit may include a double-layered structure of a transparent conductive oxide layer-metal layer, or a triple-layered structure of a transparent conductive oxide layer-metal layer-transparent conductive oxide layer. In this case, flexible property may be improved by the metal layer, and a signal transmission speed may also be improved by a low resistance of the metal layer. Corrosive resistance and transparency may be improved by the transparent conductive oxide layer.

The antenna unit 320 may include a blackened portion, so that a reflectance at a surface of the antenna unit 320 may be decreased to suppress a visual recognition of the antenna unit due to a light reflectance.

In an embodiment, a surface of the metal layer included in the antenna unit 320 may be converted into a metal oxide or a metal sulfide to form a blackened layer. In an embodiment, a blackened layer such as a black material coating layer or a plating layer may be formed on the antenna unit 320 or the metal layer. The black material or plating layer may include silicon, carbon, copper, molybdenum, tin, chromium, molybdenum, nickel, cobalt, or an oxide, sulfide or alloy containing at least one therefrom.

A composition and a thickness of the blackened layer may be adjusted in consideration of a reflectance reduction effect and an antenna radiation property.

In some embodiments, the radiator 322 and the transmission line 324 may have a mesh-pattern structure to improve a transmittance. In this case, a dummy mesh pattern (not illustrated) may be formed around the radiator 322 and the transmission line 324.

The signal pad 326 and the ground pad 328 may be a solid pattern formed of the above-described metal or alloy in consideration of a feeding resistance reduction, a noise absorption efficiency, an addition of a horizontal radiation, etc.

In an embodiment, the radiator 322 may have the mesh-pattern structure, and at least a portion of the transmission line 324 may include a solid structure.

The radiator 322 may be disposed in a display area of the image display device, and the signal pad 326 and the ground pad 328 may be disposed in a non-display area or a bezel area of the image display device. At least a portion of the transmission line 324 may also be disposed in the non-display area or the bezel area.

In exemplary embodiments, the package board 100 may be electrically connected to the antenna unit 320 on the first core layer 110.

In an embodiment, the feeding wirings 120 may be connected to or bonded to the signal pads 326 of the antenna units 320. For example, a portion of the coverlay film of the package board 100 may be removed to expose one end portions of the feeding wirings 120. The exposed one end portions of the feeding wirings 120 may be bonded to the signal pads 326.

For example, a conductive bonding structure such as an anisotropic conductive film (ACF) may be attached on the signal pads 326, and then a bonding region BR of the package board 100 in which the one end portions of the feeding wirings 120 are located may be disposed on the conductive bonding structure. Thereafter, the bonding region BR of the package board 100 may be attached to the antenna device 300 by a heat treatment/pressurization process, and the feeding wiring 120 may be electrically connected to each signal pad 326.

As illustrated in FIG. 5, the feeding wirings 120 may be independently connected or bonded to each of the signal pads 326 of the antenna units 320. In this case, power and control signals may be independently supplied from an antenna driving integrated circuit (IC) chip 460 to each antenna unit 320.

In exemplary embodiments, the package board 100 and the circuit board 400 may be electrically connected to each other through the connector 200.

In some embodiments, the connector 200 may serve as a Board to Board (B2B) connector, and may include a first connector 210 and a second connector 220.

As described above, the first connector 210 may be mounted on the package board 100 using a surface mount technology (SMT) to be electrically connected to the terminal ends of the feeding wirings 120.

The circuit board 400 may be, e.g., a main board of the image display device, and may be a rigid printed circuit board. For example, the circuit board 400 may include a resin (e.g., epoxy resin) layer impregnated with an inorganic material such as glass fiber (e.g., a prepreg) as a second core layer 410. The circuit board 400 may include circuit wirings distributed on a surface of the second core layer 410 and at an inside of the second core layer 410.

In exemplary embodiments, the circuit board 400 may further include a connection wiring 420 extending on one surface of the second core layer 410 and a second via structure 440 penetrating through the second core layer 410.

For example, the second via structure 440 may be formed as a substantially integral member with the connection wiring 420. For example, a via hole penetrating the second core layer 410 may be formed, and the connection wiring 420 and the second via structure 440 may be formed of substantially the same material.

In exemplary embodiments, a second connection pad 430 may be disposed on the other surface of the second core layer 410. For example, the second connection pad 430 may be electrically connected to the connection wiring 420 through the second via structure 440 on the other surface of the second core layer 410.

The antenna driving IC chip 460 may be mounted on the other surface of the second core layer 410 of the circuit board 400. As described above, the second connector 220 may be mounted on one surface of the second core layer 410 using, e.g., the surface mount technology (SMT).

For example, the second connector 220 may be electrically connected to the antenna driving IC chip 460 through the second connection pad 430, the second via structure 440 and the connection wire 420.

For example, the second connector 220 may include second terminals 224 electrically connected to each of the second connection pads 430. In this case, an intermediate structure of the antenna driving IC chip 460—the connection wiring 420—the second via structure 440—the second connection pad 430—the second terminal 224 may be formed. Accordingly, the second connector 220 and the antenna driving IC chip 460 disposed on different surfaces of the second core layer 410 may be easily electrically connected through the intermediate structure.

In some embodiments, a second ground 450 may be formed on the other surface of the second core layer 410.

For example, the second ground 450 may be spaced apart from the second connection pad 430 on the other surface of the second core layer to surround the second connection pad 430.

In this case, noises that may be generated in the connection structure of the connection wiring 420—the second via structure 440—the second connection pad 430 may be shielded, and a signal loss may be reduced. Accordingly, signaling efficiency signal transmitted to the antenna unit may be enhanced.

In some embodiments, the second ground 450 and the second connection pad 430 may be disposed at the same level. Thus, a distance between the second connection pad 430 and the second ground 450 may become relatively uniform. Accordingly, the above-described noise shielding and signal loss prevention may be more effectively implemented.

For example, the connection wiring 420, the second via structure 440, the second connection pad 430 and the second ground 450 may be formed of substantially the same metal and/or alloy as those for the above-described antenna unit 320.

In some embodiments, a plurality of the second connection pads 330 may be arranged to form second connection pad columns having a double-column structure disposed in a width direction of the second core layer 410.

For example, the second connection pad columns may be arranged such that the second connection pads 430 included in different second connection pad columns may be staggered or offset from each other in the width direction. In this case, a sufficient separation distance may be obtained between the second terminals 224 electrically connected to the second connection pads 430. Accordingly, signal interference and signal loss between the neighboring second connection pads 430 or between the neighboring second terminals 224 may be reduced.

For example, the second ground 450 may be disposed between the second connection pads 430 or the second terminals 224. In this case, a repeated arrangement structure of the second connection pad 430 (or the second terminal 224) and the second ground 450 may be formed. Accordingly, an additional signal interference prevention and noise shielding effect between the connection pads or the terminals may be implemented.

As indicated by an arrow in FIG. 5, the first connector 210 included in the package board 100 and the second connector 220 mounted on the circuit board 400 may be coupled to each other. For example, the first connector 210 may be provided as a plug connector or a male connector, and the second connector 220 may be provided as a receptacle connector or a female connector.

Accordingly, the package board 100 and the circuit board 400 may be connected through the connector 200, and the antenna driving IC chip 460 and the antenna unit 320 may be electrically connected. Thus, feeding/control signals (e.g., a phase, a beam tilting signal, etc.) may be applied from the antenna driving IC chip 460 to the antenna unit 320. Further, an intermediate structure of the package board 100—the connector 200—the circuit board 400 may be formed.

Thus, the package board 100 and the circuit board 400 may be easily coupled to each other by using the connector 200 without an additional attaching process or a heating/pressing process such as a bonding process.

Therefore, a dielectric loss due to thermal damages to the board and an increase of resistance due to wiring damages caused by the heating/pressing process may be prevented to suppress the signal loss in the antenna unit 320.

Further, the package board 100 on which the first connector 210 is mounted may be bent such that the first connector 210 and the second connector 220 may be coupled to each other. Thus, a connection with the circuit board 400 disposed at a rear portion of the image display device may be easily implemented.

In some embodiments, a circuit device 470 and a control device 480 may be mounted on the circuit board 400 in addition to the antenna driving IC chip 460. The circuit device 470 may include, e.g., a capacitor such as a multi-layered ceramic capacitor (MLCC), an inductor, a resistor, or the like. The control device 480 may include, e.g., a touch sensor driving IC chip, an application processor (AP) chip, or the like.

Figure 6:
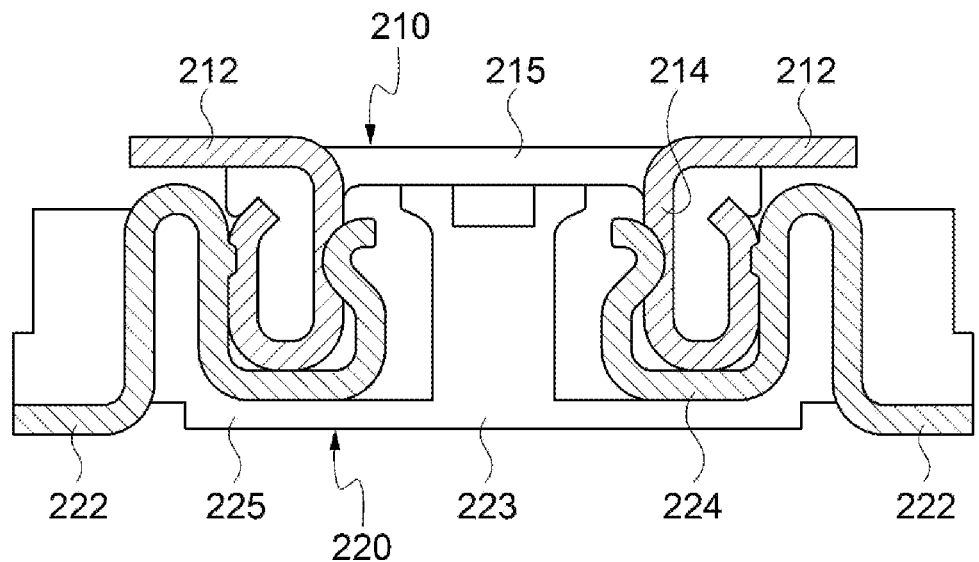
FIG. 6 is a schematic cross-sectional view illustrating a connector in accordance with exemplary embodiments.

FIG. 6 is a schematic cross-sectional view illustrating a connector in accordance with exemplary embodiments. Specifically, FIG. 6 is a schematic cross-sectional view of the connector 200 in a combination of the first connector 210 and the second connector 220 taken along a line I-I' of FIG. 1.

Referring to FIG. 6, each of the first connector 210 and the second connector 220 may include terminals having a double-column structure.

The first connector 210 may include a first insulator 215, and first terminals 214 may be arranged on the first insulator 215 in the double-column structure. First connection leads 212 may extend to both sides of the first connector 210 in the row direction to form first lead columns having the double-column structure.

For example, the first terminal 214 or the first connection lead 212 may contact the extension portion 134 of the first connection pad 130.

The second connector 220 may include a second insulator 225, and the second terminals 224 may be arranged on the second insulator 225 in a double-column structure. The second connection leads 222 may extend to both sides of the second connector 220 in the row direction to form second lead columns having the double-column structure. For example, the second insulator 225 may include an insulating barrier 223 that may separate two pad columns.

For example, the second terminal 224 or the first connection lead 222 may be in contact with and electrically connected to the second connection pad 430.

In some embodiments, the first terminals 214 included in the first connector 210 may serve as plugs, and the second terminals 224 included in the second connector 220 may serve as landing pads. Accordingly, each of the first terminals 214 may be physically and electrically coupled to each of the second terminals 224.

In an embodiment, the first and second insulators 215 and 225 may include an insulating material that may have a permittivity (Dk, or dielectric constant) in a range from 2 to 3.5, and a loss tangent (Df, or a dielectric loss) in a range from 0.0015 to 0.007.

Within the above range, for example, in a communication band of a high-frequency or ultra-high frequency range of 20 GHz or more, signal loss and gain reduction in the connector 200 may be prevented and sufficient radiation properties may be obtained from the antenna units 320.

In some embodiments, the first and second insulators 215 and 225 may include a liquid crystal polymer (LCP) structure, a polyphenylene sulfide (PPS) structure, and/or a modified polyimide (MPI) structure.

Figure 7:
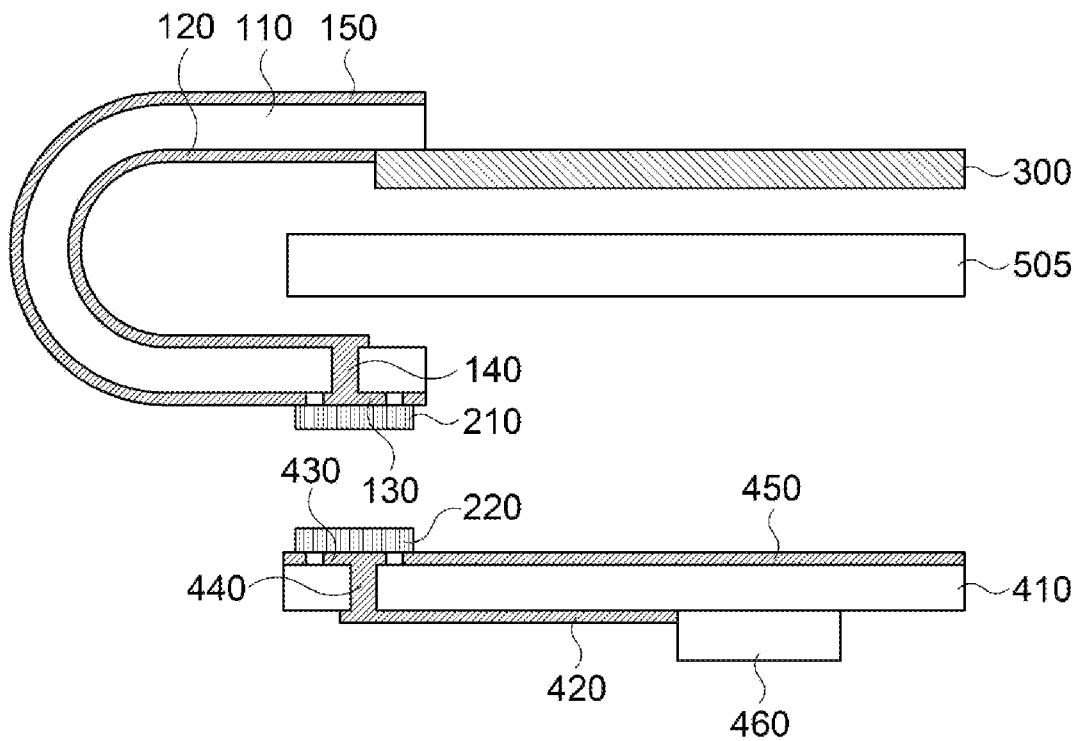
FIGS. 7 and 8 are a schematic cross-sectional view and a schematic top plan view, respectively, illustrating an image display device in accordance with exemplary embodiments.
Figure 8:
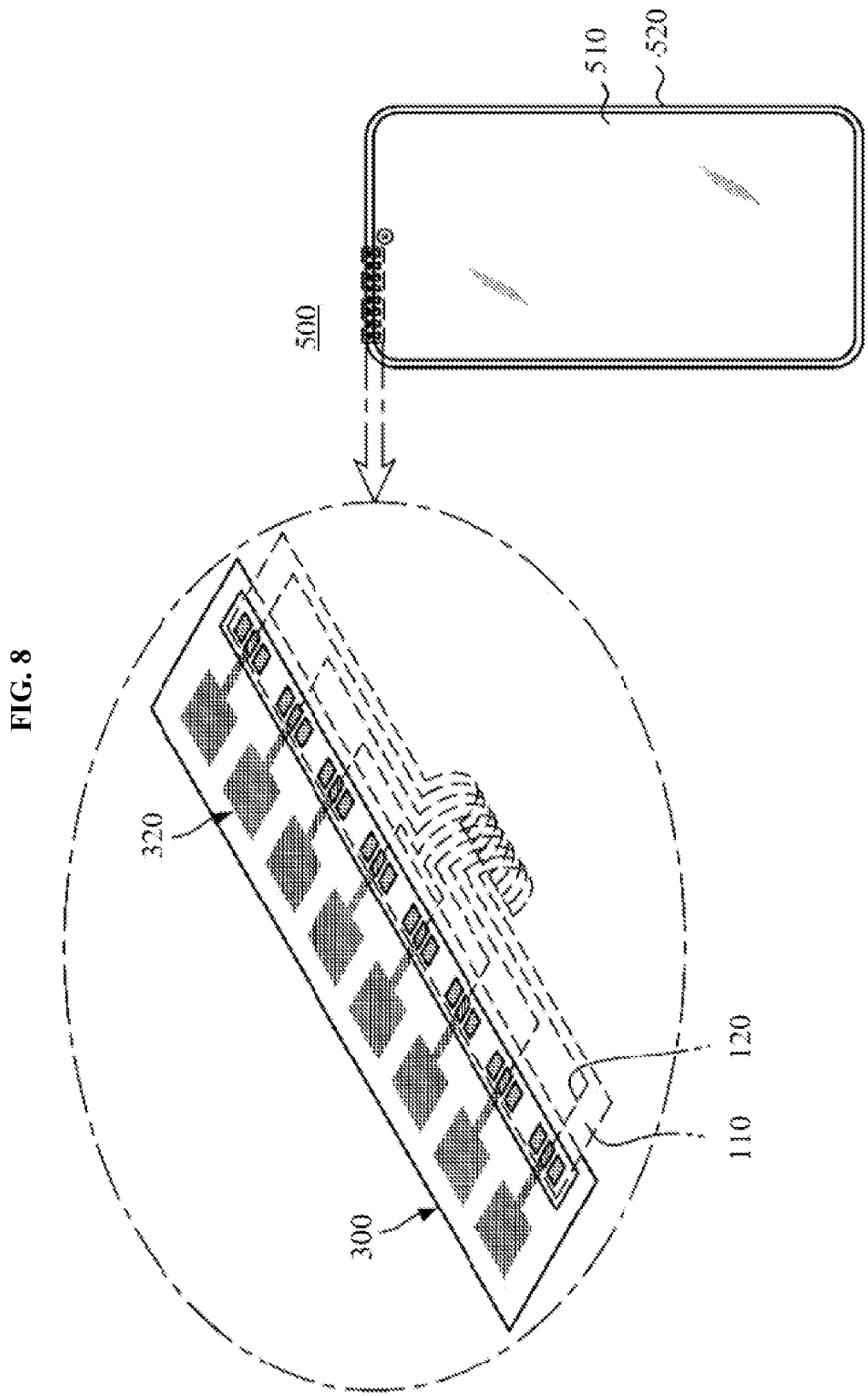

FIGS. 7 and 8 are a schematic cross-sectional view and a schematic top plan view, respectively, illustrating an image display device in accordance with exemplary embodiments.

Referring to FIGS. 7 and 8, an image display device 500 may be fabricated in the form of, e.g., a smartphone, and FIG. 7 illustrates a front portion or a window surface of the image display device 500. The front portion of the image display device 500 may include a display area 510 and a peripheral area 520. The peripheral area 520 may correspond to, e.g., a light-shielding portion or a bezel portion of the image display device.

For example, the antenna device 300 included in the above-described antenna package may be disposed toward the front portion of the image display device 500, and may be disposed on a display panel 505. In an embodiment, the radiators 322 may be at least partially disposed on the display area 510.

In this case, the radiator 322 may include a mesh-pattern structure, and a decrease of transmittance due to the radiator 322 may be prevented. The pads 326 and 328 included in the antenna unit 320 may be formed in a solid metal pattern, and may be disposed in the peripheral area 520 to prevent degradation of an image quality.

In some embodiments, the package board 100 may be bent and disposed at a rear portion of the image display device 500, and may extend toward the circuit board 400 (e.g., the main board) on which the antenna driving IC chip 460 is mounted.

The package board 100 and the circuit board 400 may be interconnected through the connector 200, so that feeding and antenna driving control to the antenna device 300 may be performed through the antenna driving IC chip 460.

As described above, the feeding wirings 120 may be electrically connected to the first connector 210 through the first via structure 140 and the first connection pad 130 including the head portion and the extension portion to improve the signal efficiency to the antenna unit 320.

What is claimed is:

1. A package board comprising:
    a first core layer having a first surface and a second surface that face each other;
    a feeding wiring extending on the first surface of the first core layer;
    a first via structure penetrating through the first core layer;
    a first connection pad disposed on the second surface of the first core layer to be electrically connected to the feeding wiring through the first via structure, the first connection pad comprising a head portion in contact with the first via structure and an extension portion protruding from the head portion; and
    a first connector mounted on the second surface of the first core layer, the first connector comprising a first terminal electrically connected to the extension portion of the first connection pad.

2. The package board of claim 1, further comprising a first ground formed on the second surface of the first core layer and spaced apart from the first connection pad to surround the first connection pad.

3. The package board of claim 2, wherein the first connection pad and the first ground are disposed at the same level.

4. The package board of claim 2, wherein a distance from a center of the head portion to the first ground is constant.

5. The package board of claim 4, wherein the head portion has a circular shape.

6. The package board of claim 2, wherein the first ground entirely surrounds the first connection pad in a plan view.

7. The package board of claim 2, wherein a separation space having a closed trench shape is formed between the first ground and the first connection pad.

8. The package board of claim 1, wherein a width of the extension portion is smaller than a width of the head portion.

9. The package board of claim 1, wherein the feeding wiring comprises a feeding pad portion electrically connected to the first via structure at a terminal end portion thereof, and the feeding pad portion has a width expanded from the feeding wiring.

10. The package board of claim 1, wherein a plurality of the first connection pads are arranged to form first connection pad columns which forms a double-column structure disposed in a width direction of the first core layer, and
    the first connection pad columns are arranged such that first connection pads included in different first connection pad columns are staggered from each other in the width direction.

11. An antenna package comprising:
    an antenna device comprising an antenna unit; and
    the package board of claim 1 electrically connected to the antenna unit through the feeding wiring.

12. The antenna package of claim 11, wherein the antenna unit comprises a radiator, a transmission line connected to the radiator and a signal pad connected to an end portion of the transmission line, and
    the signal pad is electrically connected to the feeding wiring.

13. The antenna package of claim 11, further comprising:
    a circuit board comprising a second core layer, a connection wiring extending on one surface of the second core layer and a second via structure penetrating through the second core layer;
    a second connection pad disposed on the other surface of the second core layer and electrically connected to the connection wiring through the second via structure; and
    a second connector mounted on the other surface of the second core layer to be coupled to the first connector, the second connector comprising a second terminal electrically connected to the second connection pad and the first terminal.

14. The antenna package of claim 13, further comprising a second ground disposed on the other surface of the second core layer and spaced apart from the second connection pad to surround the second connection pad, and
    the second connection pad and the second ground are disposed at the same level.

15. The antenna package of claim 13, further comprising an antenna driving integrated circuit chip mounted on the other surface of the second core layer and electrically connected to the second connector through the connection wiring and the second via structure.

16. An image display device, comprising:
    a display panel; and
    the antenna package of claim 11 disposed on the display panel.

* * * * *